United States Patent
Marley

(10) Patent No.: US 8,066,897 B2
(45) Date of Patent: Nov. 29, 2011

(54) DYNAMIC HARD MAGNET THICKNESS ADJUSTMENT FOR REDUCED VARIATION IN FREE LAYER STABILIZATION FIELD IN A MAGNETORESISTIVE SENSOR

(75) Inventor: Arley Cleveland Marley, San Jose, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 829 days.

(21) Appl. No.: 11/966,028

(22) Filed: Dec. 28, 2007

(65) Prior Publication Data

US 2009/0166331 A1  Jul. 2, 2009

(51) Int. Cl.
 C03C 25/68 (2006.01)
 G11B 5/127 (2006.01)
 G11B 5/33 (2006.01)

(52) U.S. Cl. ............ 216/84; 216/88; 360/113; 360/313; 360/324

(58) Field of Classification Search .................... 216/59, 216/84, 41, 37, 16, 88, 22; 451/41; 29/603.01, 29/603.09, 603.12, 603.15; 360/113, 313–315, 360/324; 324/207.21; 365/158; 428/811
See application file for complete search history.

(56) References Cited

U.S. PATENT DOCUMENTS

| | | | |
|---|---|---|---|
| 5,729,410 A | 3/1998 | Fontana, Jr. et al. | 360/113 |
| 6,005,753 A | 12/1999 | Fontana, Jr. et al. | 360/113 |
| 6,255,814 B1 | 7/2001 | Shimazawa et al. | 324/252 |
| 6,487,056 B1 | 11/2002 | Gibbons et al. | 360/327.31 |
| 6,700,759 B1 | 3/2004 | Knapp et al. | 360/324.2 |
| 6,754,053 B2 | 6/2004 | Yoshikawa et al. | 360/324.1 |
| 6,754,055 B2 | 6/2004 | Ono et al. | 360/324.12 |
| 7,046,487 B2 | 5/2006 | Terunuma | 360/319 |
| 7,061,725 B2 | 6/2006 | Seigler | 360/313 |
| 7,075,294 B2 | 7/2006 | Matsukuma et al. | 324/210 |
| 7,134,185 B1* | 11/2006 | Knapp et al. | 29/603.14 |
| 7,230,845 B1 | 6/2007 | Wang et al. | 365/173 |
| 2003/0030949 A1 | 2/2003 | Ghaly et al. | 360/327.31 |
| 2005/0063100 A1 | 3/2005 | Kautzky et al. | 360/313 |
| 2005/0073300 A1* | 4/2005 | Matsukuma et al. | 324/210 |
| 2005/0264956 A1* | 12/2005 | Lee et al. | 360/324.12 |
| 2005/0286178 A1* | 12/2005 | Gill et al. | 360/324.2 |
| 2006/0230601 A1* | 10/2006 | Gill et al. | 29/603.13 |
| 2006/0279881 A1 | 12/2006 | Sato | 360/324.12 |
| 2007/0081279 A1* | 4/2007 | Hong et al. | 360/324.1 |
| 2007/0183099 A1 | 8/2007 | Pinarbasi | 360/324.1 |

FOREIGN PATENT DOCUMENTS

| | | |
|---|---|---|
| JP | 11073612 | 3/1999 |
| JP | 2001006129 | 1/2001 |
| JP | 2002359414 | 12/2002 |
| JP | 2004103809 | 4/2004 |

* cited by examiner

*Primary Examiner* — Nadine G Norton
*Assistant Examiner* — Patti Lin
(74) *Attorney, Agent, or Firm* — Zilka-Kotab, PC

(57) ABSTRACT

A method for manufacturing a current perpendicular to plane magnetoresistive sensor that allows for dynamic adjustment of free layer biasing to compensate for variations in thickness of an electrically insulating layer that separates the hard bias layers from the free layer. During fabrication of the sensor, the actual thickness of the insulation layers is measured. Then, to maintain a desired magnetic stabilization of the free layer one of three options can be utilized. Option one; adjust the stripe height target to maintain the desired magnetic stabilization. Option two; adjust the hard magnet thickness to maintain the desired magnetic stabilization. Option three; use a combination of option one and option two, adjusting both the stripe height target and the hard magnet thickness to maintain the desired magnetic stabilization.

22 Claims, 17 Drawing Sheets

DYNAMIC HARD MAGNET THICKNESS ADJUSTMENT FOR REDUCED VARIATION IN FREE LAYER STABILIZATION FIELD IN A MAGNETORESISTIVE SENSOR

FIELD OF THE INVENTION

This invention relates to the construction of current perpendicular to plane magnetoresisitve sensors and more particularly to a method for controlling a free layer stabilization field in a current perpendicular to plane magnetoresisive sensor.

BACKGROUND OF THE INVENTION

The heart of a computer's long-term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air-bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height can be on the order of Angstroms. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air-bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, referred to as a spacer layer, sandwiched between first and second ferromagnetic layers, and hereinafter referred to as a pinned layer and a free layer. First and second leads are connected to the spin valve sensor for conducting a sense current therethrough. The magnetization of the pinned layer is pinned perpendicular to the air-bearing surface (ABS) and the magnetic moment of the free layer is biased parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos $\theta$, where $\theta$ is the angle between the magnetizations of the pinned and free layers. In a read mode, the resistance of the spin valve sensor changes proportionally to the magnitudes of the magnetic fields from the rotating disk. When a sense current is conducted through the spin valve sensor, resistance changes cause potential changes that are detected and processed as read back signals.

SUMMARY OF THE INVENTION

The present invention provides a method for manufacturing a current perpendicular to plane magnetoresistive sensor that allows for dynamic adjustment of free layer biasing to compensate for variations in the thickness of an electrically insulating layer that separates the hard bias layers from the free layer. During fabrication of the sensor, the actual thickness of the insulation layers is measured. Then, to maintain a desired magnetic stabilization of the free layer one of three options can be utilized. Option one; adjust the stripe height target to maintain the desired magnetic stabilization. Option two; adjust the hard magnet thickness to maintain the desired magnetic stabilization. Option three; use a combination of option one and option two, adjusting both the stripe height target and the hard magnet thickness to maintain the desired magnetic stabilization.

The amount of free layer magnetic stabilization provided by a bias field from the hard magnetic bias layers, is affected by the thickness of the insulation layers, the thickness of the hard magnet layers, and the stripe height of the sensor. The thicker the insulation layers, the weaker the magnetic stabilization will be. The thicker the hard magnet layers the stronger the magnetic stabilization will be. The greater the stripe height, the stronger the magnetic stabilization will be. Variations and deviations in manufacturing processes make it impossible to form the insulation layers, with an exact, consistent thicknesses. Therefore, variation in insulation layer thickness can result in variations in free layer stabilization.

The present invention advantageously allows a sensor manufacturer to compensate for these variations in insulation layer thickness, thereby dynamically adjusting the magnetic stabilization to a desired strength. During fabrication, the actual thickness of the insulation layer is measured. Then, one of three actions can be utilized. Action one, a determination is made as to what stripe height is necessary to achieve the desired free layer stabilization in a sensor having the measured insulation layer thickness. The location of the target air bearing surface plane is then determined based on this determined stripe height. A lapping operation can then be performed to form the sensor with an air bearing surface located at this determined air bearing surface plane. Action two, a determination is made as to what hard magnet thickness is necessary to achieve the desired free layer stabilization in a sensor having the measured insulation layer thickness. Using this determination the thickness of the hard magnet used in the head manufacturing is adjusted to achieve the desired free layer stabilization. Action three, using a combination of action one and action two, adjust the stripe height target and the hard magnet thickness to achieve the desired free layer stabilization.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings that are not to scale.

DETAILED DESCRIPTION OF THE INVENTION

The following describes various embodiments presently contemplated for carrying out this invention. This description is made for the purpose of illustrating the general principles of this invention and is not meant to limit the inventive concepts claimed herein.

Figure 1:
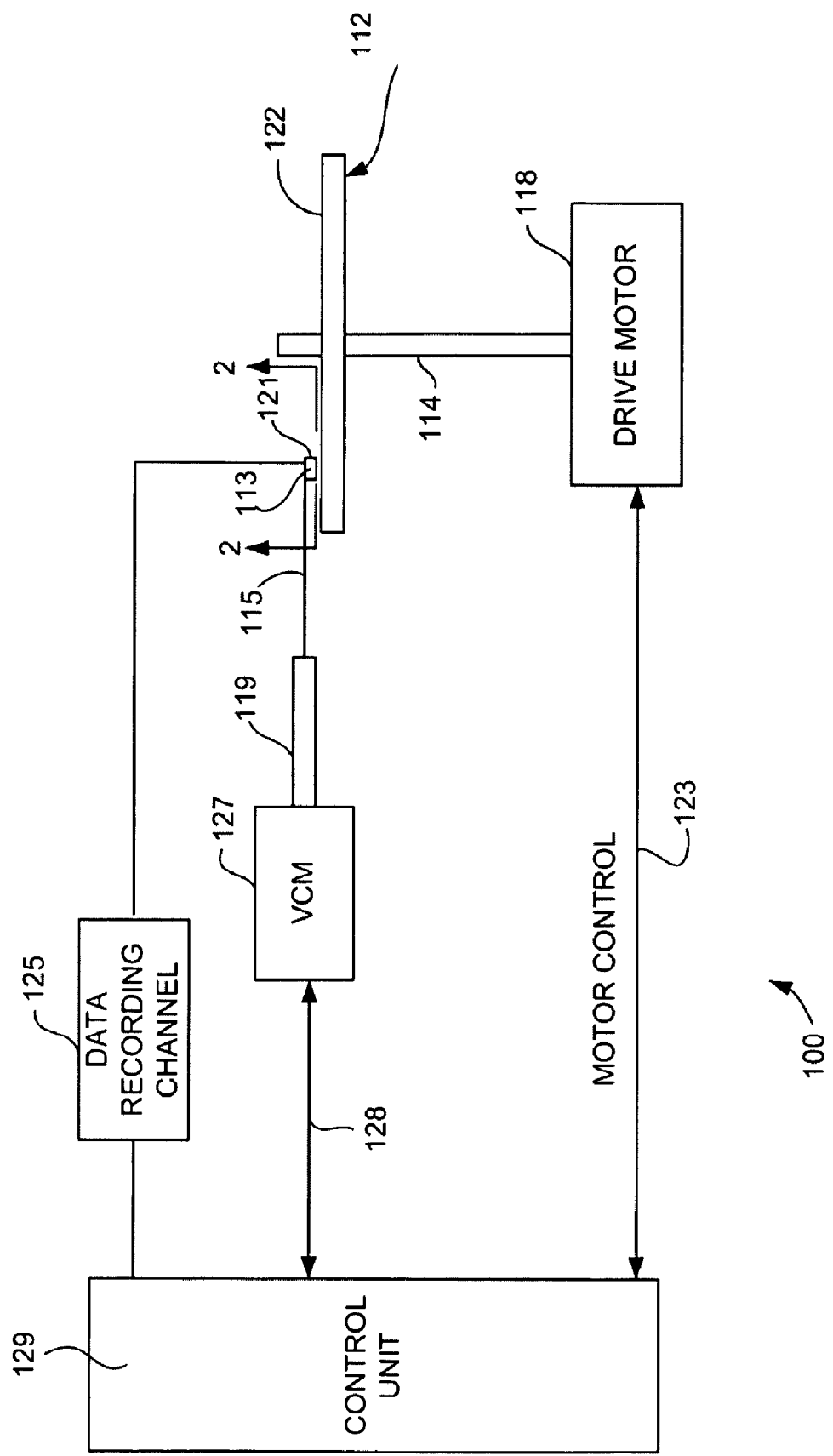
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force, which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122, which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
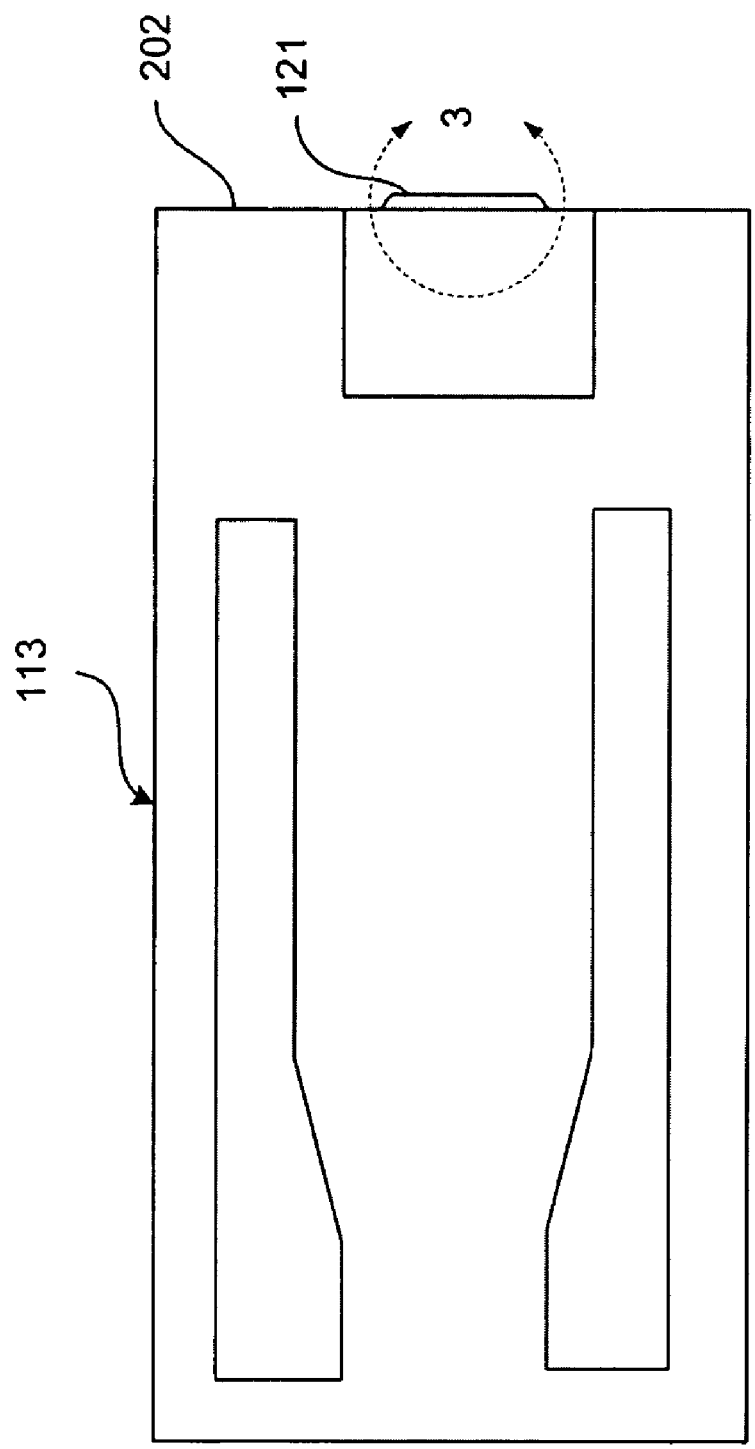
FIG. 2 is an ABS view of a slider, taken from line 2-2 of FIG. 1, illustrating the location of a magnetic head thereon.

With reference to FIG. 2, the orientation of the magnetic head 121 in a slider 113 can be seen in more detail. FIG. 2 is an ABS view of the slider 113, and as can be seen, the magnetic head including an inductive write head and a read sensor, is located at a trailing edge of the slider 202. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
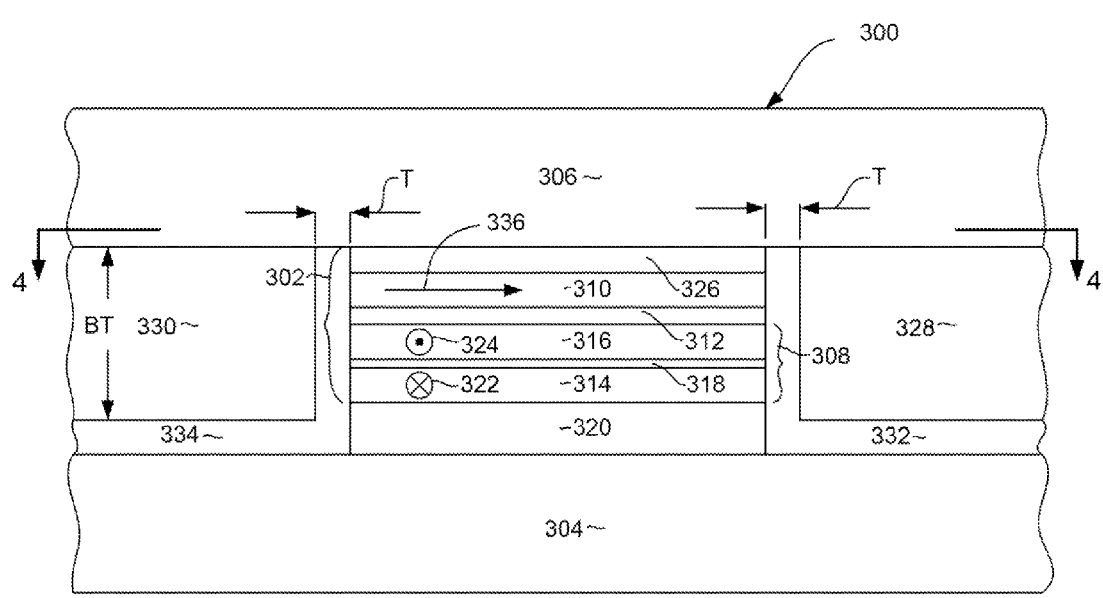
FIG. 3 is an ABS view of a magnetoresistive sensor according to an embodiment of the present invention taken from circle 3 of FIG. 2.

With reference now to FIG. 3, a magnetoresistive sensor 300 includes a sensor stack 302 sandwiched between first and second electrically conductive leads 304, 306. The leads 304, 306 can be constructed of a magnetic material such as NiFe so that they can function as magnetic shields as well as leads.

The sensor stack 302 includes a pinned layer structure 308 and a magnetic free layer 310. A non-magnetic layer 312 is sandwiched between the free layer 310 and the pinned layer structure 308. The sensor 300 can be a current perpendicular to plane giant magnetoresistive (CPP GMR) sensor or can be a tunnel valve sensor. If the sensor is CPP GMR sensor, the non-magnetic layer 312 is an electrically conductive spacer layer such as CuO. If the sensor 300 is a tunnel valve, then the non-magnetic layer 312 is a thin, electrically insulating barrier layer.

The pinned layer structure can be an antiparallel coupled structure that includes first and second magnetic layers AP1 314 and AP2 316, which are antiparallel coupled across a nonmagnetic coupling layer 318 sandwiched therebetween. A layer of antiferromagnetic material (AFM layer) 320 is exchange coupled with the AP1 layer 314, which strongly pins the magnetization 322 of the AP1 layer 314 in a first direction that is perpendicular to the air bearing surface as indicated by arrow head symbol 322. Antiparallel coupling between the AP1 and AP2 layers 314, 316 pins the magnetization of the AP2 layer in a second direction, opposite to the first direction, as indicated by arrow tail symbol 324. A capping layer 326 such as Ta can be provided at the top of the sensor stack 302 to protect the sensor layers during manufacture.

With continued reference to FIG. 3, first and second hard bias layers 328, 330 are provided at either side of the sensor stack 302, and are separated from the sensor stack 302 and from at least one of the leads 304 by insulation layers 332, 334. The hard bias layers 328, 330 are constructed of a magnetically hard, high coercivity material such as CoPt or CoPtCr. A seed layer (not shown) may be formed beneath the hard bias layers 328, 330. When magnetized, the hard bias layers 328, 330 provide a magnetic bias field that biases the magnetization of the free layer in a desired direction parallel with the air bearing surface as indicated by arrow symbol 336. The insulation layers 332, 334, which can be constructed of a material such as alumina prevent current from being shunted through the hard bias layers 328, 330 during operation.

Maintaining the right amount of bias field is critical to proper sensor operation. If the bias field is too strong, the magnetization 336 of the free layer 310 will not be able to move easily enough in response to an external magnetic field, and the sensitivity of the sensor will suffer. If the bias field is too weak, the magnetization 336 of the free layer 310 will become unstable, resulting in an unacceptable level of signal noise. Such instability can render the sensor completely inoperable. Therefore, as can be seen, it is very important to maintain a desired level of bias strength for biasing the sensor.

A factor that affects the strength of the bias field is the thickness of the insulation layer, denoted as "T" in FIG. 3. The greater the thickness T of the insulation layer, the greater the distance between the free layer 310 and the hard bias layers 328, 330 and the weaker the bias field will be.

Figure 4:
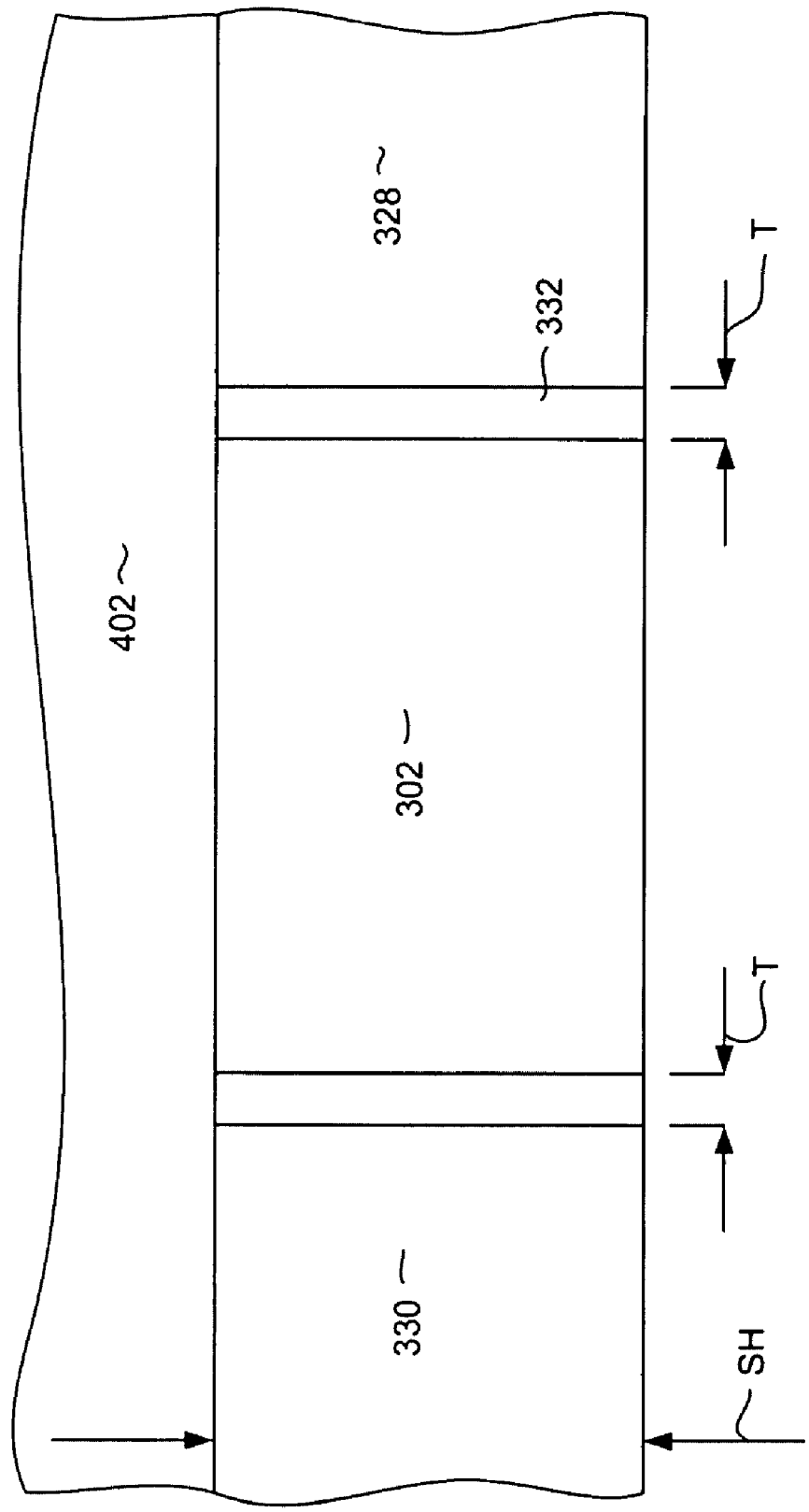
FIG. 4 is a top down cross sectional view of the sensor of FIG. 3, taken from line 4-4 of FIG. 3.

Another factor that affects free layer biasing is the stripe height of the sensor. This can be seen more clearly with reference to FIG. 4 which shows a top down cross sectional view taken from line 4-4 of FIG. 3 with the upper lead 306 removed. As can be seen in FIG. 4, the sensor 300 has a stripe height SH that is measured from the air bearing surface ABS to the back edge 404 of the sensor stack 302. The bias layers 328, 330 also extend from the ABS to the back edge 404. The larger the stripe height, the stronger the bias field will be due to the increased area of the bias layers 328, 330.

Still another factor that affects free layer biasing is the thickness BT of the bias layer as viewed in FIG. 3. If the hard bias layer thickness BT is greater, the bias field will be stronger, and if BT is smaller the bias field will be weaker.

Therefore, it can be seen that at least three factors affect the bias field (1) the thickness T of the insulation layers 332, 334; (2) the stripe height; and (3) the bias layer thickness BT. During manufacture of the write head, certain variations and deviations in the manufacturing processes can lead to variations in the bias field. As mentioned above these variations can lead to poor sensor performance or sensor failure. For example, the thickness T of the insulation layers 332, 334 can vary. The present invention provides a mechanism for compensating for these variations in bias strength, thereby ensuring optimal sensor performance.

Figure 5:
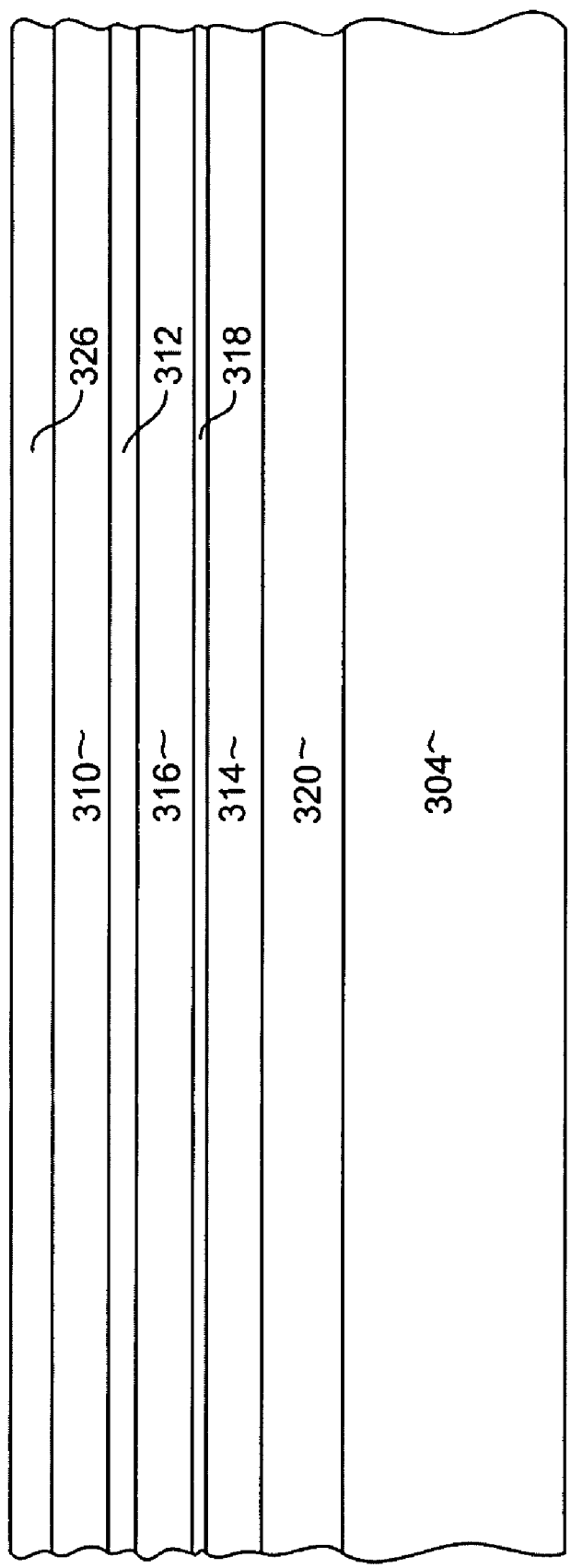
FIGS. 5-15 are views of a sensor in various intermediate stages of manufacture illustrating a method of manufacturing a sensor according to an embodiment of the invention.

With reference now to FIGS. 5-17 a method is described for manufacturing a sensor having a dynamically controlled bias field. With particular reference to FIG. 5, a series of sensor layers 320, 314, 318, 316, 312, 310, 326 (referred to collectively as sensor stack layers 302) are deposited on a substrate, which can be the lead layer 304.

Figure 6:
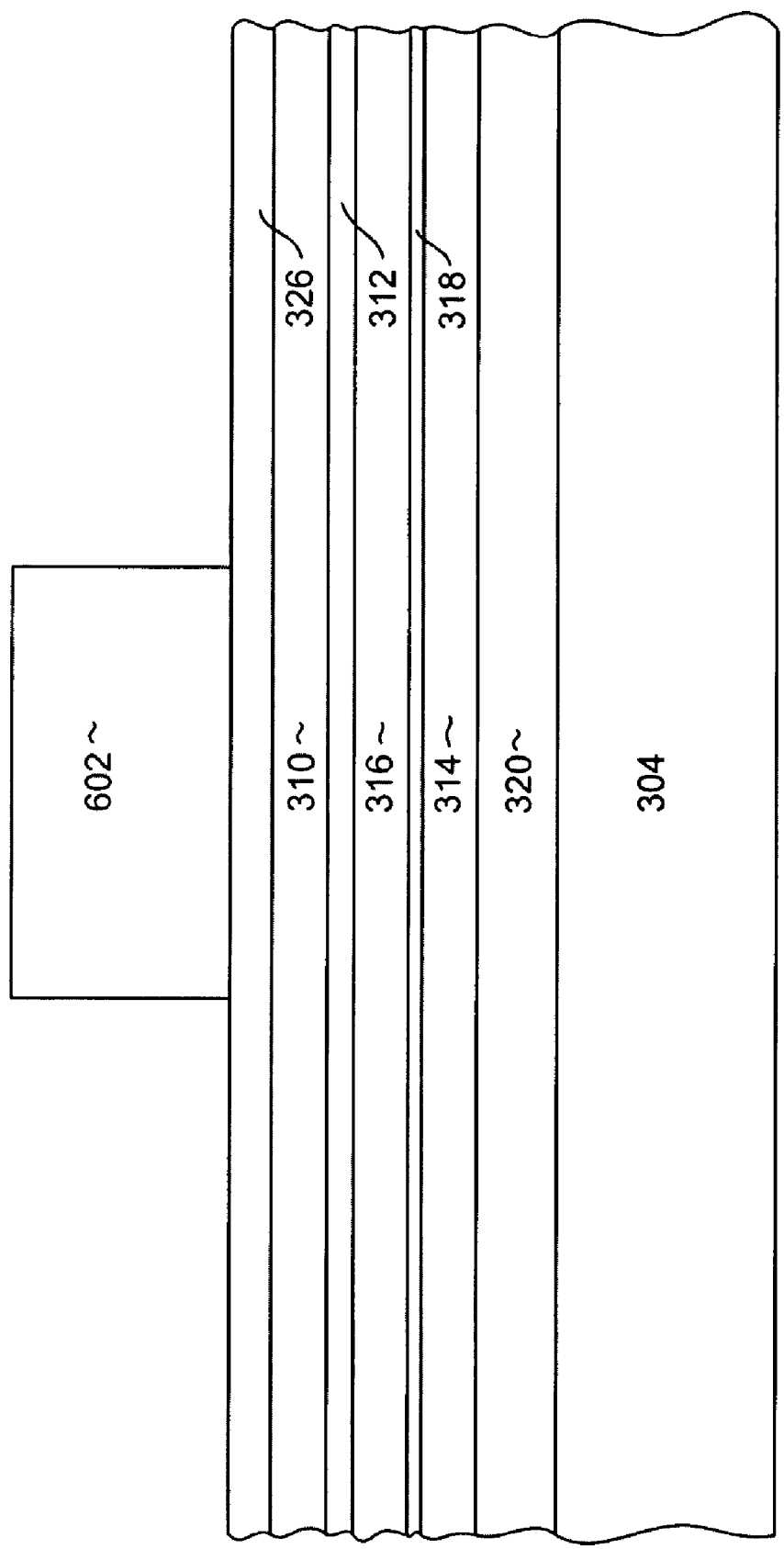
Figure 7:
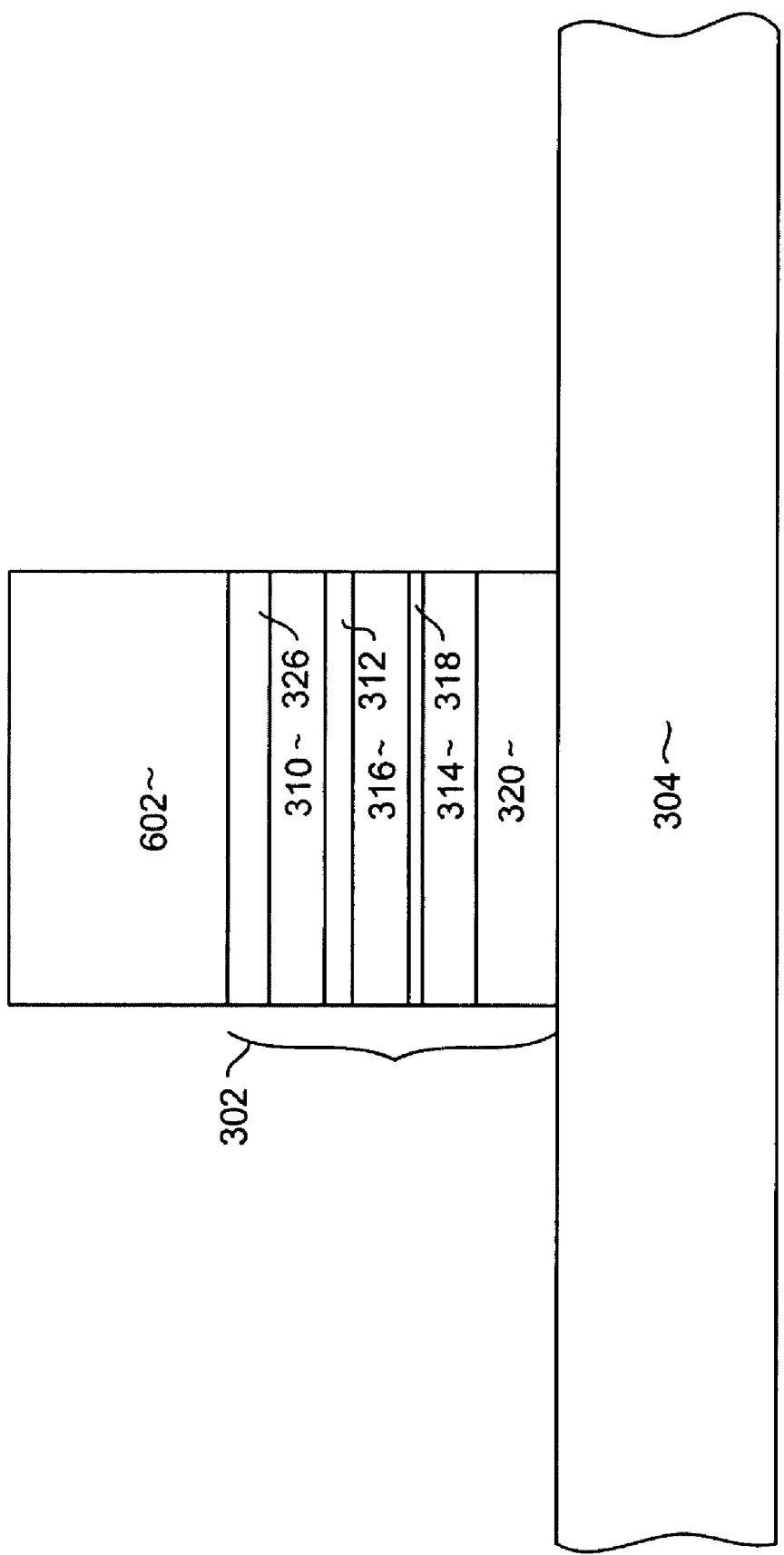

Then, with reference to FIG. 6, a first mask stricture 602 is formed over the sensor layers 302. This first mask structure is configured to define a width of the sensor stack 302 described in FIG. 3. The mask 602 may include several layers such as one or more hard mask layers, an image transfer layer and or bottom antireflective coating (BARC) as well as a photoresist layer that has been photolithographically patterned as described. Then, with reference to FIG. 7 a material removal process such as ion milling is performed to remove portions of the sensor layers 302 that are not protected by the mask structure 602.

Figure 8:
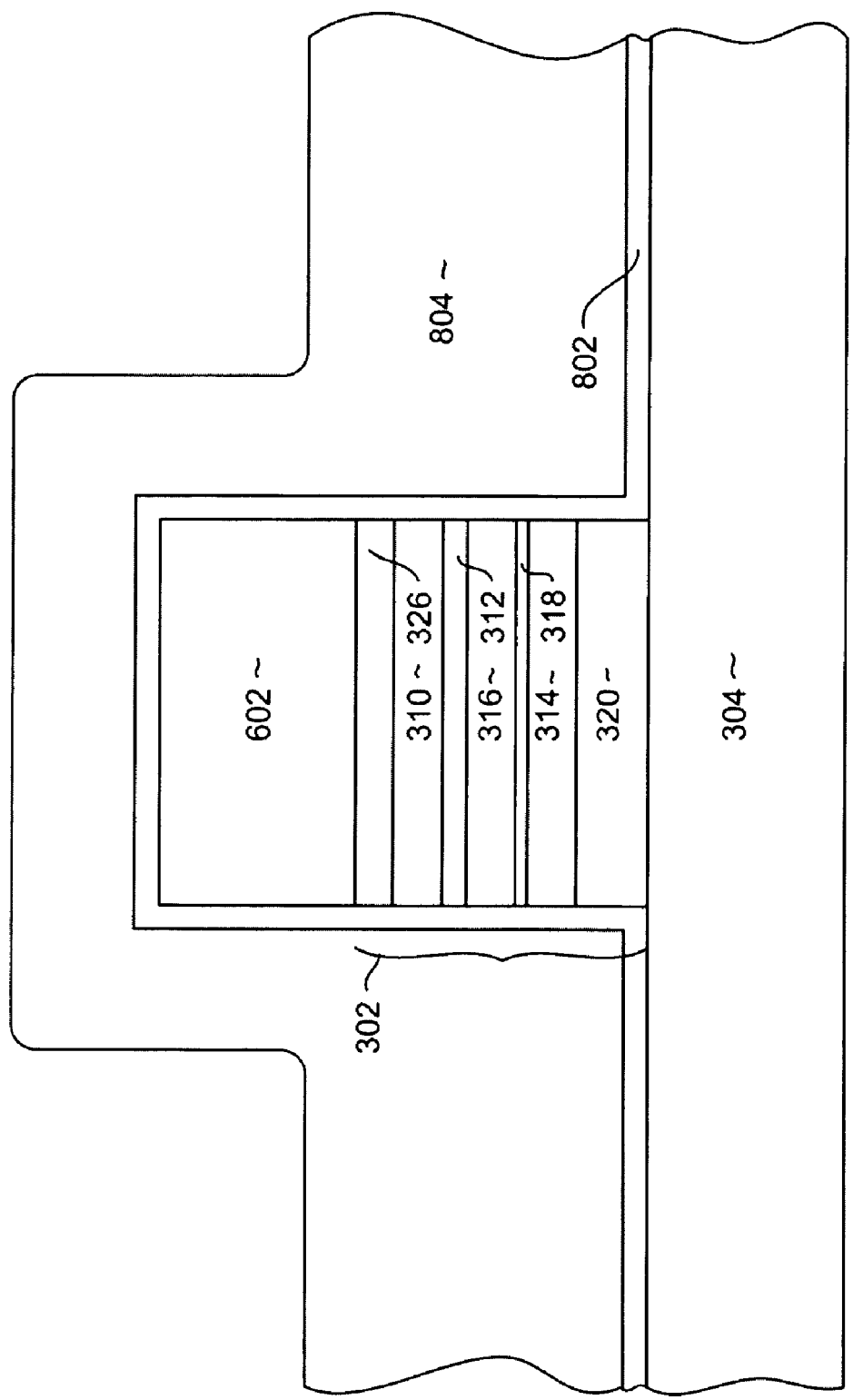
Figure 9:
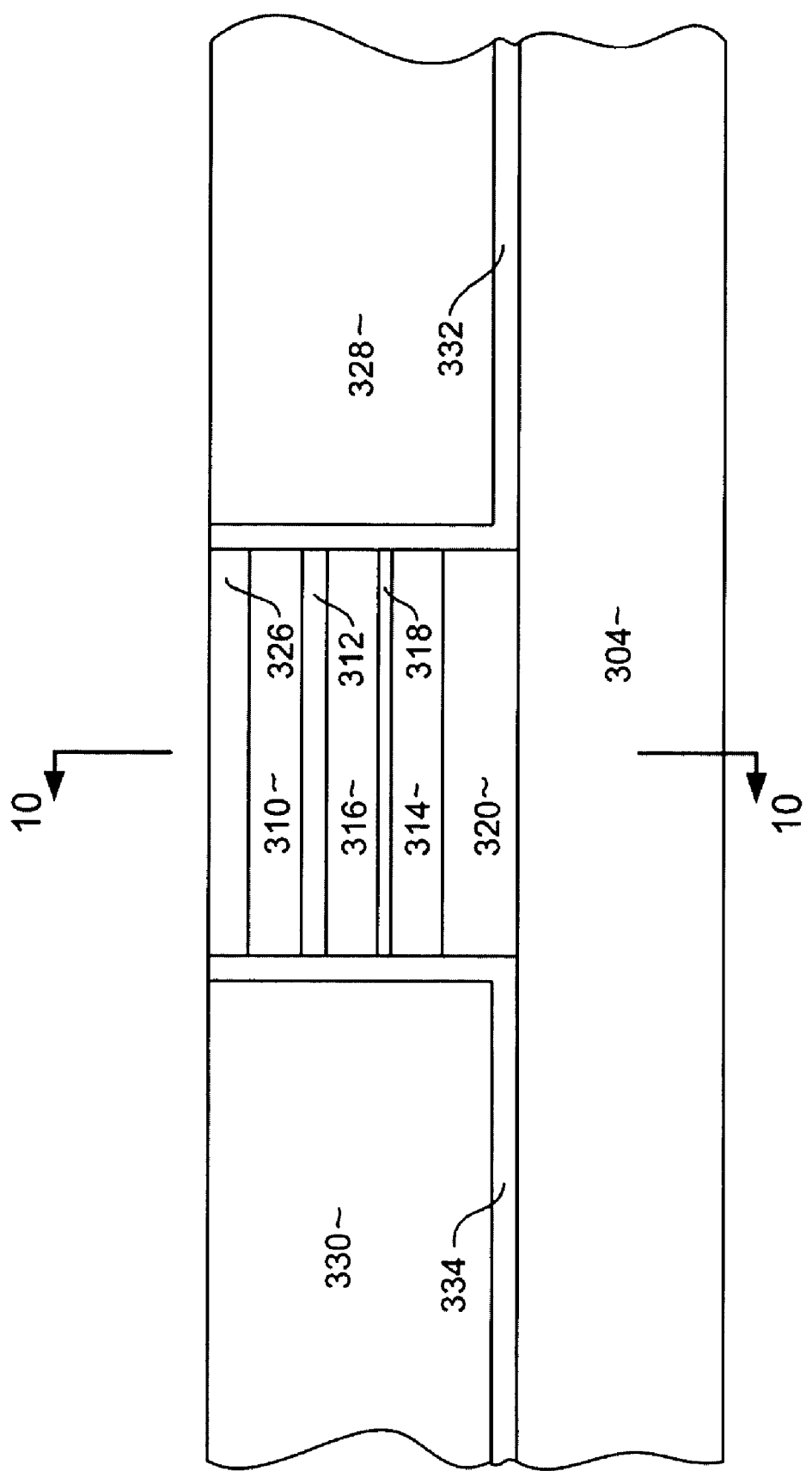
Figure 10:
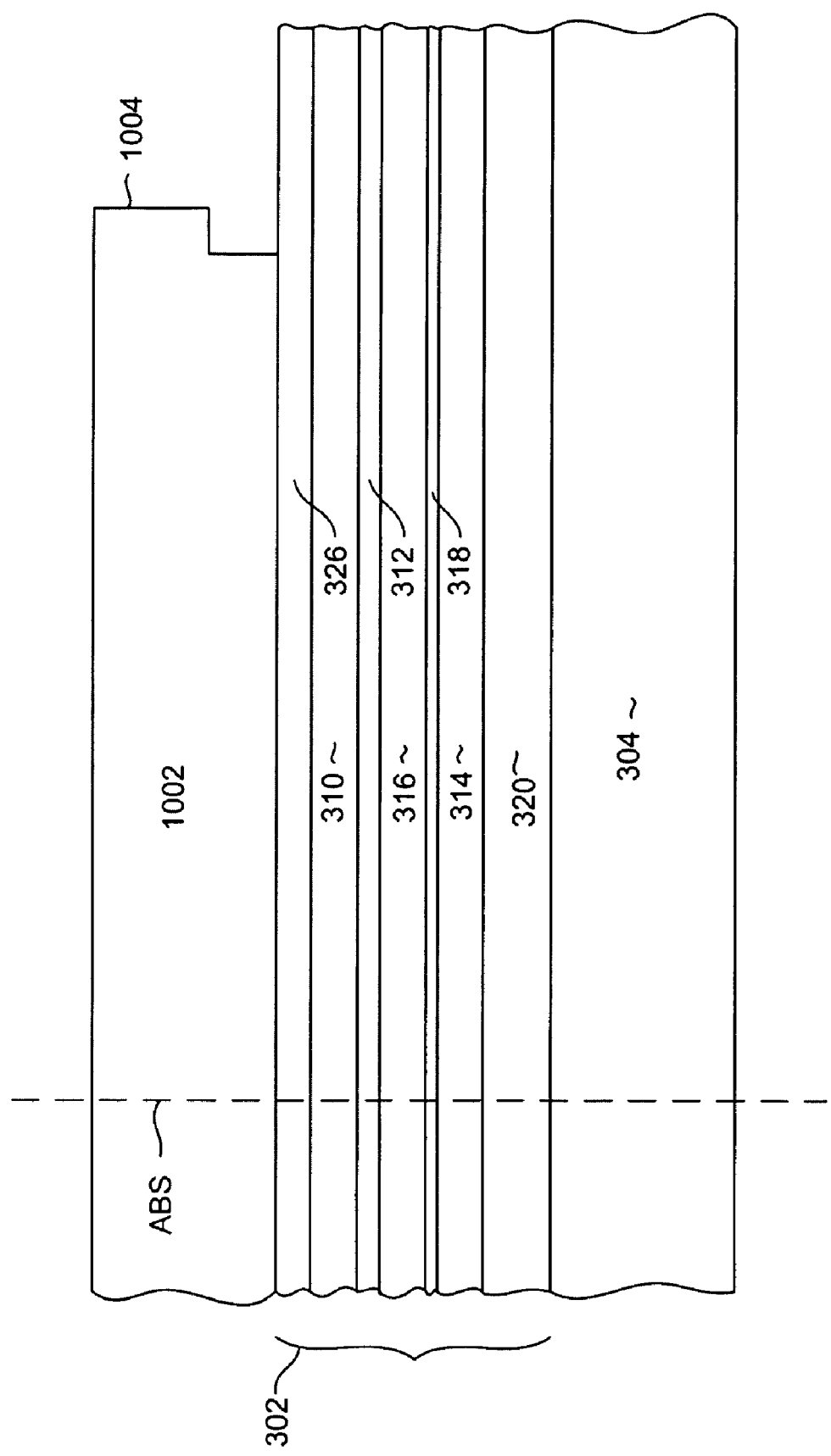
Figure 11:
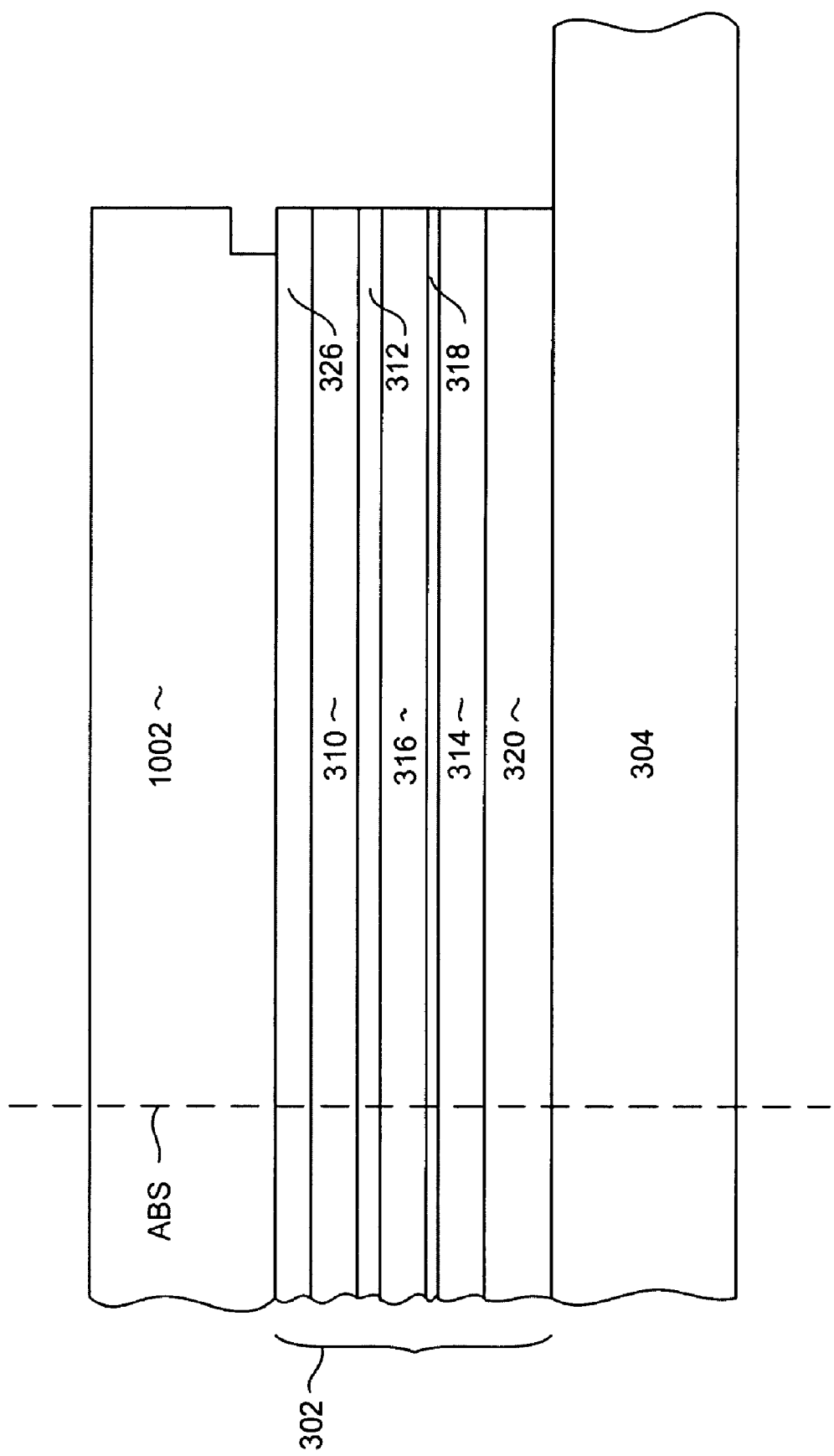

With reference to FIG. 8 a layer of electrically insulating material 802 is deposited followed by a layer of hard magnetic material 804. The electrically insulating layer 802 can be alumina and is preferably deposited by a conformal deposition method such as atomic layer deposition (ALD) or chemical vapor deposition (CVD). The magnetically hard layer can be CoPt or CoPtCr, and may be deposited over a seed layer (not shown) that improves the grain structure and coercivity of the magnetic layer 804. A chemical mechanical polishing process (CMP) can then be performed leaving a structure such as that shown in FIG. 9. The remaining portions of the insulating layer 802 (FIG. 8) forms insulation layers 332, 334 (FIG. 9). Similarly, the remaining portions of the hard magnetic layer 804 (FIG. 8) forms the hard bias layers 328, 330 (FIG. 9).

With reference now to FIG. 9 which shows a side cross sectional view (taken from line 10-10 of FIG. 9) a second mask structure 1002 is formed having an edge 1004 configured to define a strip height of the sensor as will be better understood below. As with the first mask structure 602 (FIG. 6) the mask structure 1002 can include various layers and includes a photolithographically patterned photoresist layer. Then, with reference to FIG. 11, a material removal process such as ion milling can be performed to remove portions of the sensor layers 302 that are not protected by the mask 1002. This forms a sensor stack 302 having a back edge located a desired distance form an air bearing surface plane (ABS), which will be formed in a subsequent process as described below.

Figure 12:
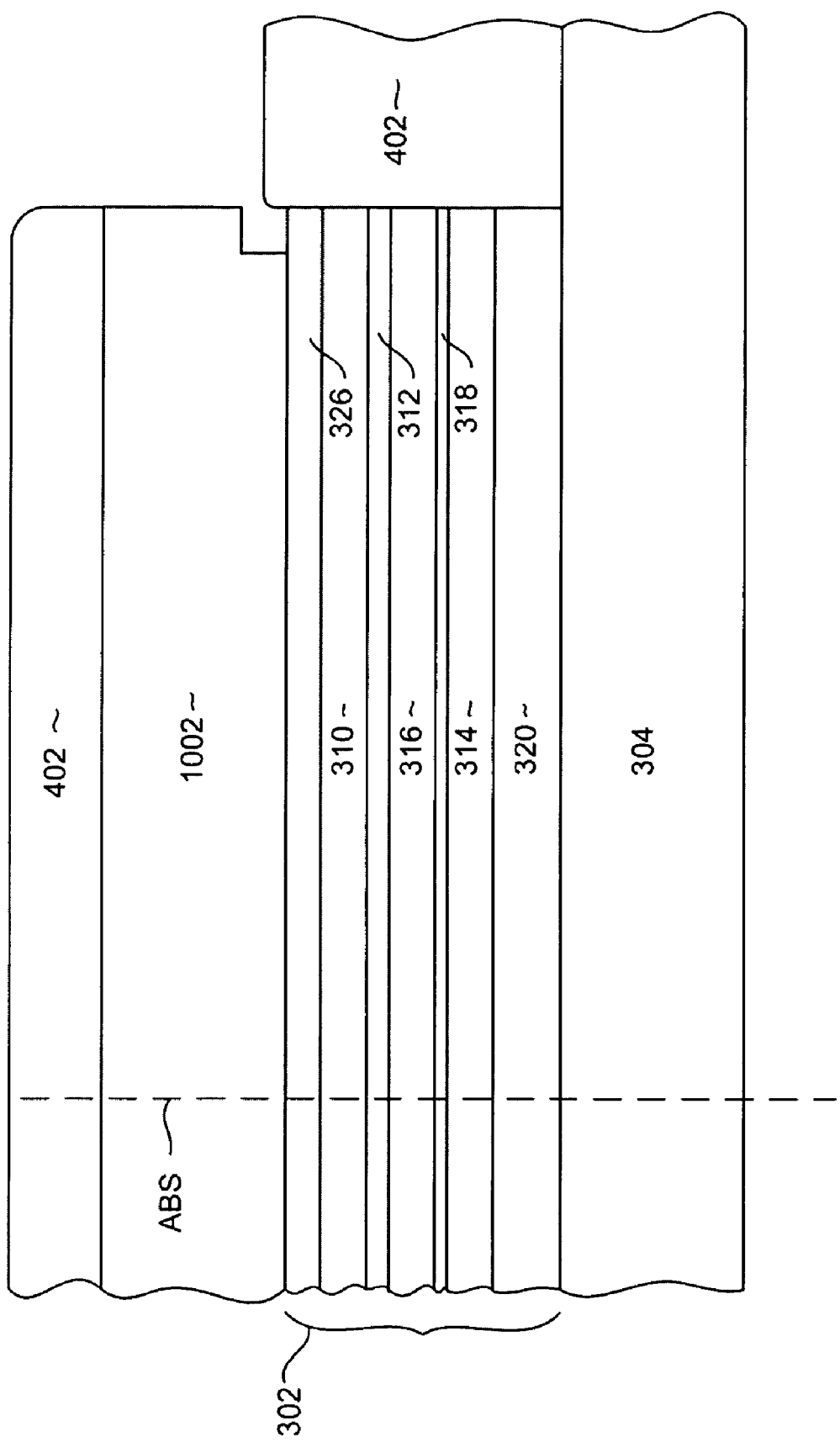
Figure 13:
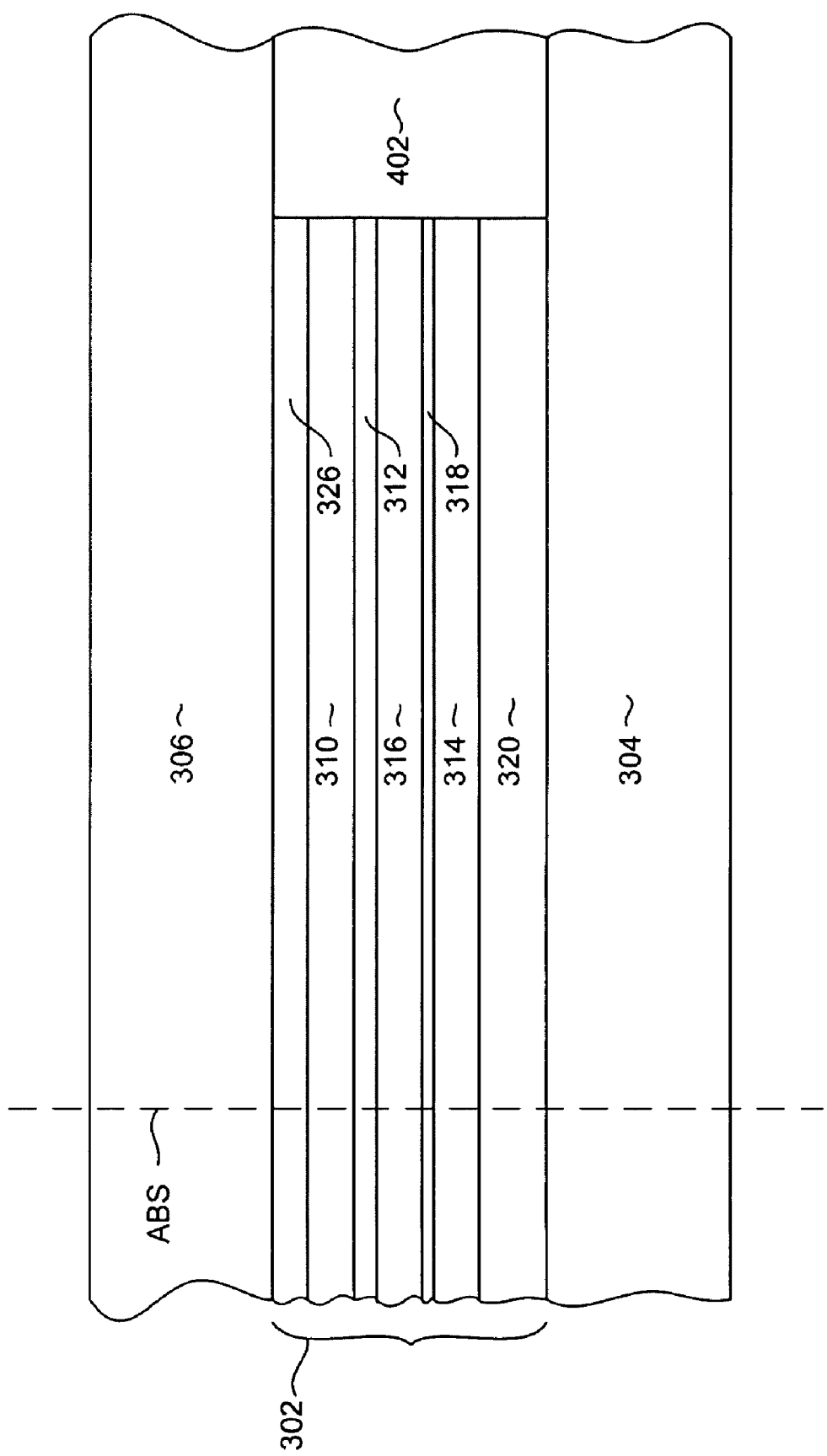

With reference now to FIG. 12 a fill layer such as alumina 402 is deposited. The mask structure 1002 can then be lifted off, and an optional chemical mechanical polishing process (CMP) can be performed. Then, an upper electrically conductive lead layer 306 can formed, such as by electroplating, resulting in a structure as shown in FIG. 13.

Figure 14:
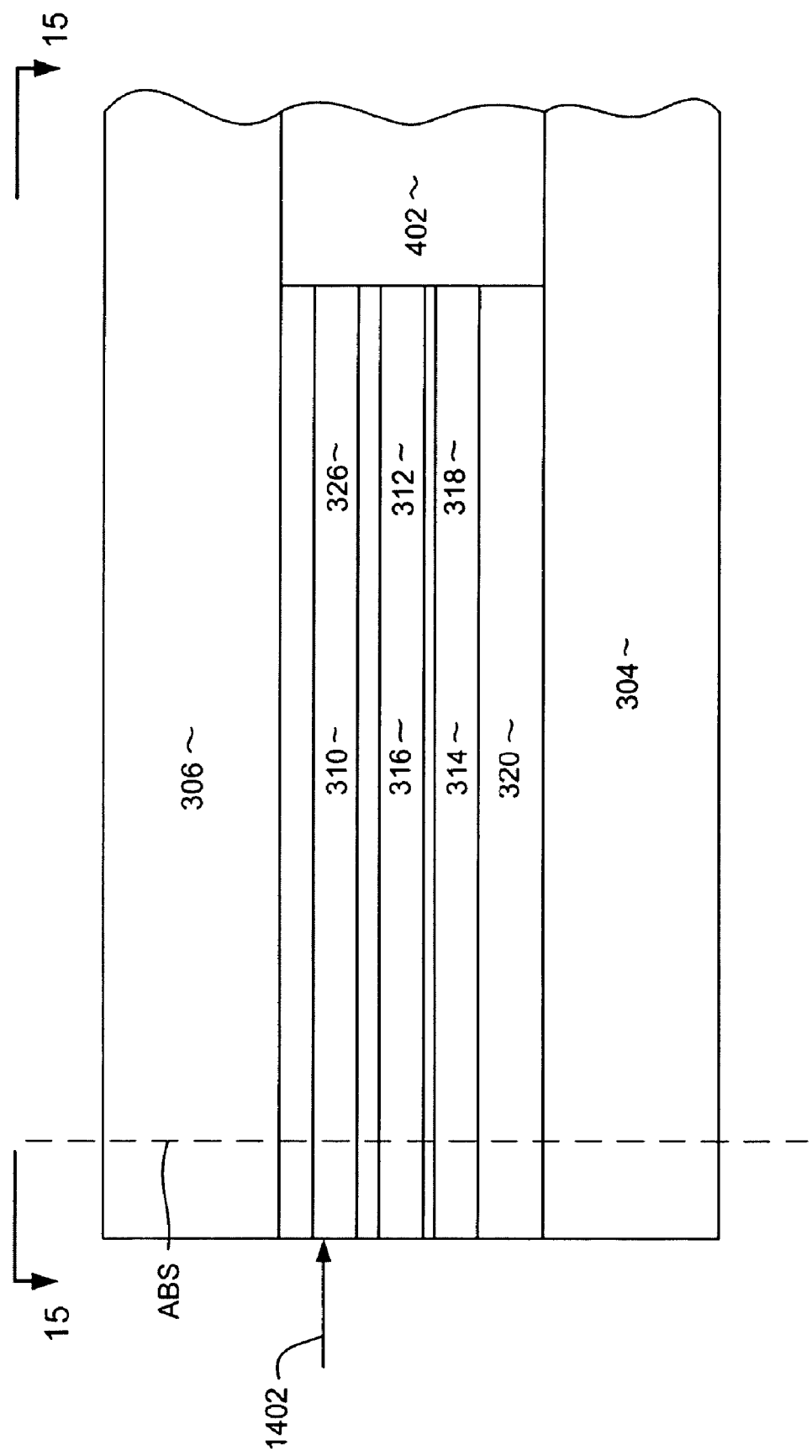
Figure 15:
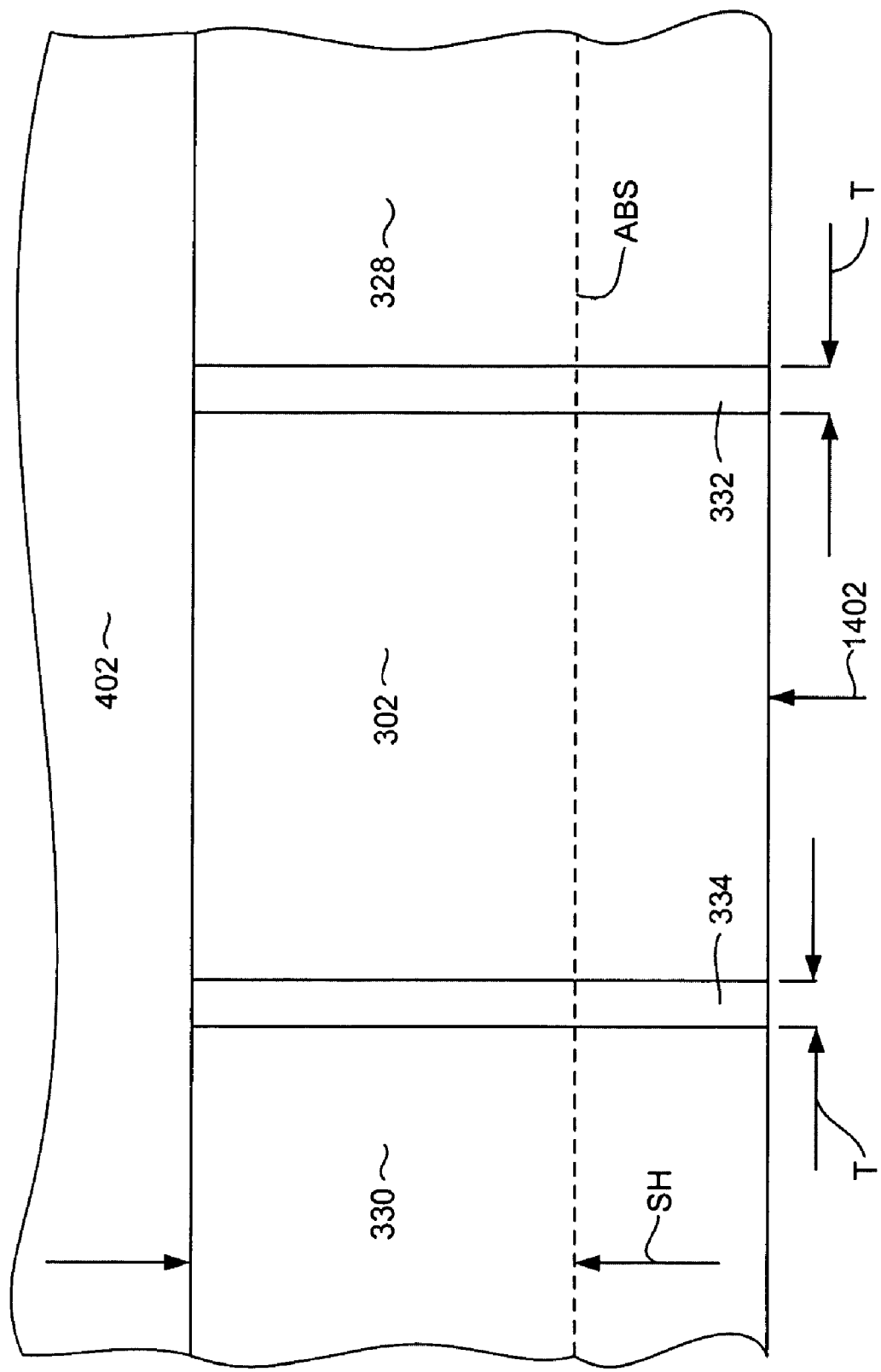

With reference now to FIG. 14, a lapping operation is performed to define an air bearing surface. Although only one sensor is shown and described, those skilled in the art will appreciate that many thousands of such sensors are formed in many rows on a wafer. After the above processes have been performed (and a write head (not shown) has been formed) the wafer is cut into rows of sliders. Thereafter, a lapping operation is performed on the row of sliders to remove sensor material from the direction indicated by arrow 1402. This can also be seen with reference to FIG. 15 which shows a top down view with the upper lead layer 306 removed. The lapping operation is perfumed until a desired ABS plane has been reached.

As mentioned above, the strength of the bias field is affected by the stripe height SH of the sensor. Therefore the strength of the bias field can be controlled by the controlling the location of the ABS during lapping. This can, therefore, be used to compensate for variations in the thickness T of the insulation layers 332, 334 due to manufacturing variations and deviations. Therefore, in order to dynamically control the bias field, the thickness T of the insulation layers 332, 334 is first measured. This can be done, for example, after the CMP process has been performed to form the structure shown in FIG. 9, and before the upper lead layer 402 has been formed. The thickness T of the insulation layers 332, 334 can be measured visually, such as through the use of an ellipsometer or some other method.

Figure 17:
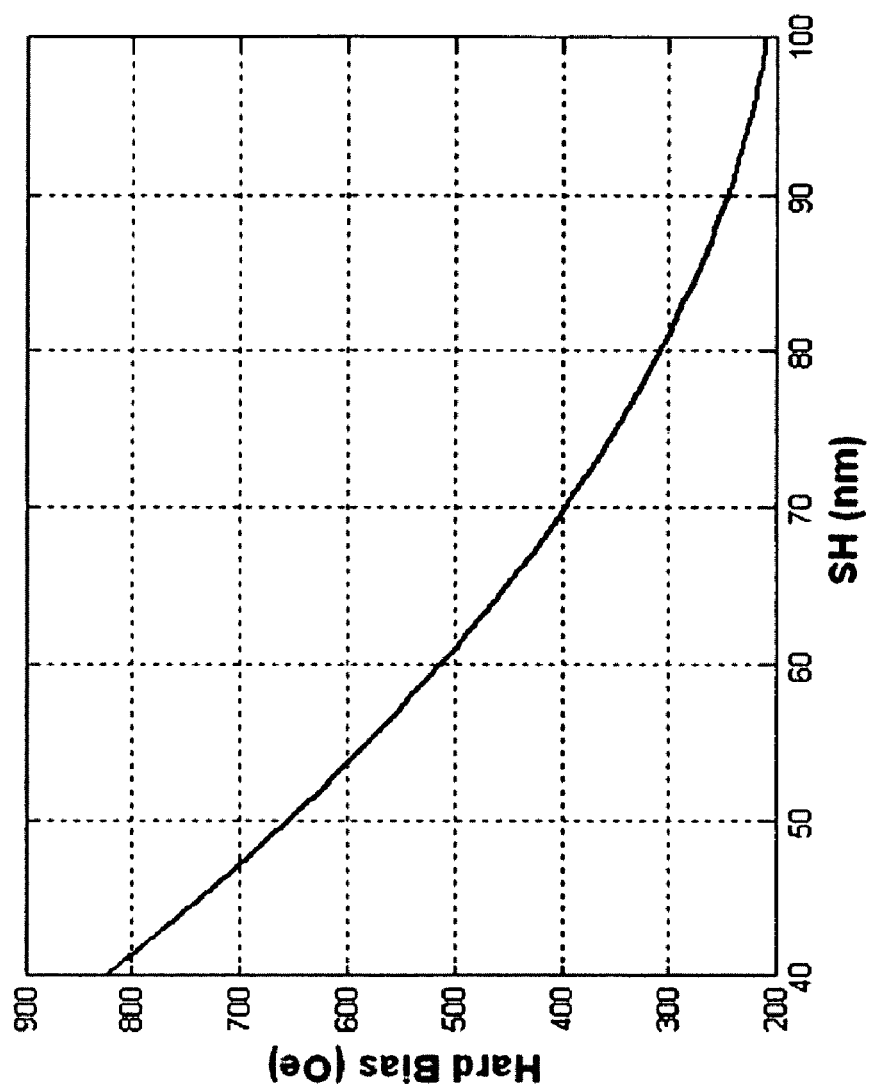
FIG. 17 is a master stabilization curve relating stripe height with stabilization.

Then, a necessary stripe height, needed to provide a desired bias field is calculated. FIG. 17 is an example of a stabilization curve relating hard bias ratio with stripe height. Therefore, the chart in FIG. 17 and measured insulation layer thickness T can be used in a feed back mechanism to determine an amount by which the stripe height can be adjusted to achieve the desired amount of free layer biasing.

As mentioned above, sensors are built on wafers, with many thousands of sensors being formed on a single wafer. The adjustment of stripe to control stabilization field can be performed on a wafer to wafer basis by measuring insulation layer thickness T for each wafer. Using the stabilization curves such as illustrated in FIG. 17 the insulation layer thickness T can be input to predict the net stabilizing field from the spacer layer thickness curve. This determines if the reader will be under or over stabilized. Over or under stabilization can be compensated for by adjusting the stripe height. The final stripe height target will be adjusted on a wafer by wafer basis to achieve equivalent net stabilization using the stabilization curve relating spacer thickness and hard bias layer thickness as illustrated in FIG. 17.

Figure 16:
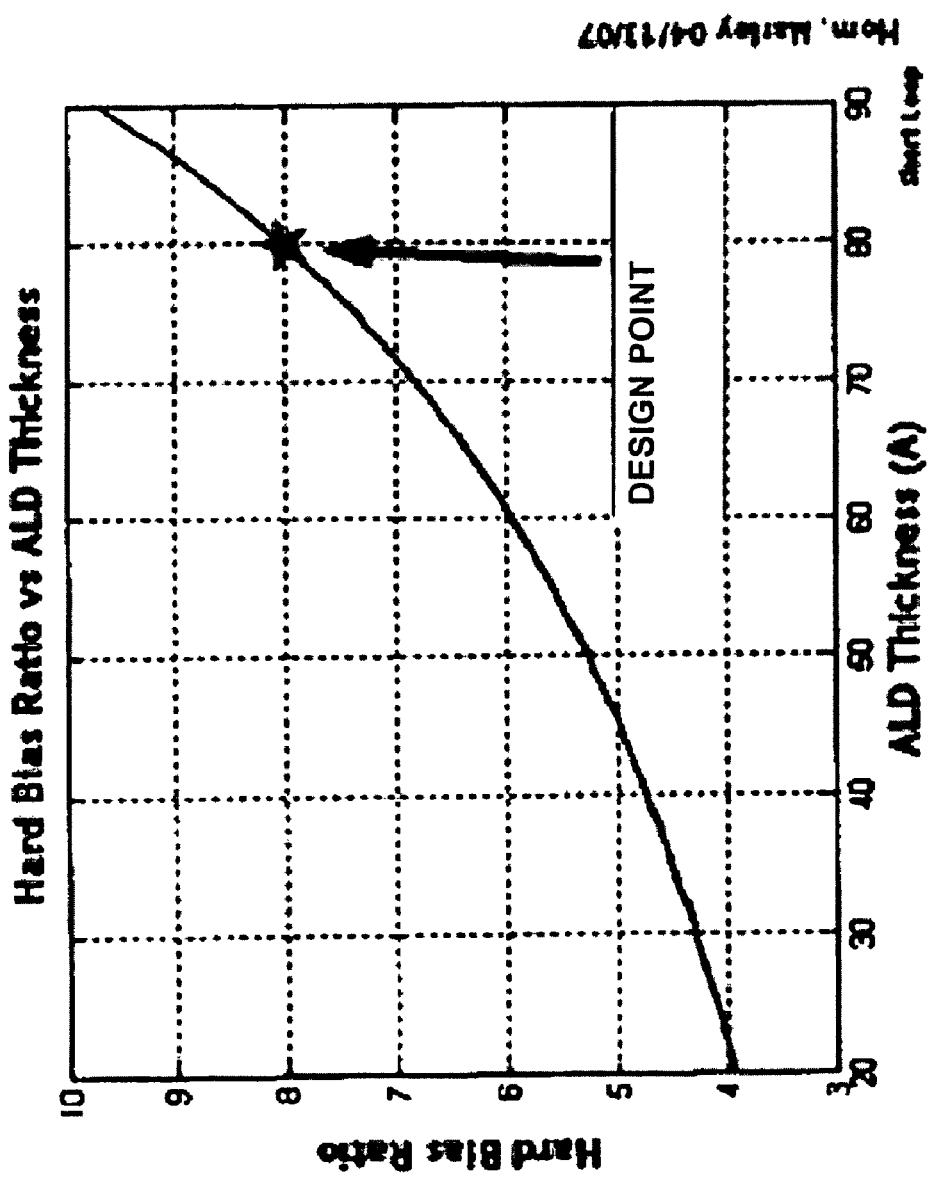
FIG. 16 is a master stabilization curve relating insulation layer thickness with hard magnetic layer thickness.

Similarly, FIG. 16 is a stabilization curve relating the bias ratio of a sensor with hard bias thickness BT (FIG. 3). This too can be used in a feedback mechanism to adjust the thickness BT of the bias layers 328, 330 to achieve a desired amount of free layer biasing. If greater free layer biasing is needed, the thickness BT of the hard bias layer can be increased, and if less free layer biasing is needed, then the thickness BT of the hard bias layer 328, 330 can be reduced.

Therefore, there are two mechanisms available for adjusting the amount of free layer biasing. While either of these mechanisms (stripe height adjustment and hard bias thickness adjustment) can be used alone, they can also be used together to adjust the amount of free layer biasing to a desired level. Therefore, once the insulation layer thickness T is known, the necessary adjustments to either or both of the stripe height and bias layer thickness BT can be made to achieve the desired amount of free layer biasing.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetoresistive sensor, comprising:
    forming a magnetoresistive sensor stack having first and second sides;
    forming an electrically insulating layer at each of the sides, the electrically insulating layer having a thickness;
    forming a hard magnetic bias layer adjacent to the electrically insulating layer;
    measuring an actual thickness of the electrically insulating layer after the electrically insulating layer has been formed; and
    determining a desired air bearing surface location to achieve a desired magnetic bias field based upon the measured thickness of the electrically insulating layer; and
    forming an air bearing surface at the determined air bearing surface location.

2. A method as in claim 1 wherein the forming an air bearing surface further comprises performing a lapping operation and terminating the lapping operation when the determined air bearing surface location has been reached.

3. A method as in claim 1 wherein the sensor is constructed on a wafer and wherein the measuring a thickness of the electrically insulating layer and determining a desired air bearing surface location to achieve a desired magnetic bias field based upon the measured thickness of the electrically insulating layer are performed on a wafer to wafer basis.

4. A method as in claim 1 further comprising, before measuring the thickness of the electrically insulating layer, performing a chemical mechanical polishing process.

5. A method as in claim 1 further comprising, prior to determining a desired air bearing surface location, determining a desired amount of magnetic stabilization and wherein the determined air bearing surface location and desired magnetic bias field are chosen to achieve the desired amount of magnetic stabilization.

6. A method for manufacturing a magnetoresistive sensor, comprising:
    forming a magnetoresistive sensor stack having first and second sides;
    forming an electrically insulating layer at each of the sides, the electrically insulating layer having a thickness;
    forming a hard magnetic bias layer adjacent to the electrically insulating layer;
    measuring a thickness of the electrically insulating layer; and
    determining a desired air bearing surface location to achieve a desired magnetic bias field based upon the measured thickness of the electrically insulating layer; and
    forming an air bearing surface at the determined air bearing surface location;
    wherein the determining a desired air bearing surface location includes utilizing a master stabilization curve that relates spacer thickness and hard magnetic layer thickness.

7. A method for manufacturing a magnetoresistive sensor, comprising:
    forming a magnetoresistive sensor stack having first and second sides;
    forming an electrically insulating layer at each of the sides, the electrically insulating layer having a thickness;
    forming a hard magnetic bias layer adjacent to the electrically insulating layer;
    measuring a thickness of the electrically insulating layer; and
    determining a desired air bearing surface location to achieve a desired magnetic bias field based upon the measured thickness of the electrically insulating layer; and
    forming an air bearing surface at the determined air bearing surface location;
    wherein the determined air bearing surface location defines a stripe height, and wherein the determining a desired air bearing surface location includes utilizing a master stabilization curve that relates stripe height with a stabilization field.

8. A method for manufacturing a magnetoresistive sensor, comprising:
    forming a magnetoresistive sensor stack having first and second sides;
    forming an electrically insulating layer at each of the sides, the electrically insulating layer having a thickness;
    forming a hard magnetic bias layer adjacent to the electrically insulating layer;
    measuring a thickness of the electrically insulating layer; and
    determining a desired air bearing surface location to achieve a desired magnetic bias field based upon the measured thickness of the electrically insulating layer; and
    forming an air bearing surface at the determined air bearing surface location;
    wherein the determined air bearing surface location defines a stripe height, and wherein the determining a desired air bearing surface location includes utilizing a first master stabilization curve that relates spacer layer thickness with hard magnetic layer thickness and a second master stabilization curve that relates stripe height with a stabilization field.

9. A method for manufacturing a magnetoresistive sensor, comprising:
    providing a wafer;
    forming a first electrically conductive lead layer on the wafer;
    depositing a plurality of sensor layers over the substrate;
    forming mask structure over the plurality of sensor layers, the first mask structure having a width configured to define a width of a sensor stack;
    performing a ion milling to remove a portion of the sensor layers that is not protected by the mask structure;

depositing an electrically insulating material;
depositing a hard magnetic material;
performing a chemical mechanical polishing;
measuring an actual thickness of the electrically insulating layer after the electrically insulating material has been deposited;
determining a sensor stripe height for achieving a desired magnetic stabilization based at least in part upon the measured thickness of the electrically insulting layer;
slicing the wafer into rows; and
performing a lapping operation so as to achieve the determined sensor stripe height.

10. A method as in claim 9 wherein the hard magnetic layer comprises CoPt.

11. A method as in claim 9 wherein the hard magnetic layer comprises CoPtCr.

12. A method as in claim 9 further comprising before depositing the hard magnetic layer, depositing a seed layer, and wherein the hard magnetic layer comprises CoPt.

13. A method as in claim 9 further comprising before depositing the hard magnetic layer, depositing a seed layer, and wherein the hard magnetic layer comprises CoPtCr.

14. A method as in claim 9 wherein the determining a desired stripe height is performed on a wafer by wafer basis.

15. A method as in claim 9 wherein the sensor stack includes a magnetic free layer, and wherein the desired magnetic stabilization biases a magnetization of the magnetic free layer with sufficient strength to maintain sensor stability while also maintaining sensor sensitivity.

16. A method as in claim 9 further comprising, determining a desired hard bias layer thickness to achieve the desired magnetic stabilization, and adjusting the bias layer thickness to achieve the desired magnetic stabilization.

17. A method as in claim 9 further wherein the mask structure is a first mask structure and the ion milling is a first ion milling, the method further comprising, after performing the first ion milling:
forming a second mask structure over the sensor layers, the mask structure having an edge configured to define a back edge of the sensor stack; and
performing a second ion milling to remove portions of the sensor layers that are not protected by the second mask structure.

18. A method as in claim 17, wherein the sensor stripe height is defined by the distance between the back edge of the sensor stack and an air bearing surface plane, and wherein the lapping operation is performed just until the air bearing surface plane has been reached.

19. A method for manufacturing a magnetoresistive sensor, comprising:
providing a wafer;
forming a first electrically conductive lead layer on the wafer;
depositing a plurality of sensor layers over the substrate;
forming mask structure over the plurality of sensor layers, the first mask structure having a width configured to define a width of a sensor stack;
performing a ion milling to remove a portion of the sensor layers that is not protected by the mask structure;
depositing an electrically insulating material;
depositing a hard magnetic material;
performing a chemical mechanical polishing;
measuring a thickness of the electrically insulating layer;
determining a sensor stripe height for achieving a desired magnetic stabilization based at least in part upon the measured thickness of the electrically insulting layer;
slicing the wafer into rows; and
performing a lapping operation so as to achieve the determined sensor stripe height; wherein the stripe height is determined using a master stabilization curve that relates the thickness of the electrically insulating layer with a thickness of the hard magnetic layer after lapping.

20. A method for manufacturing a magnetoresistive sensor, comprising:
providing a wafer;
forming a first electrically conductive lead layer on the wafer;
depositing a plurality of sensor layers over the substrate;
forming mask structure over the plurality of sensor layers, the first mask structure having a width configured to define a width of a sensor stack;
performing a ion milling to remove a portion of the sensor layers that is not protected by the mask structure;
depositing an electrically insulating material;
depositing a hard magnetic material;
performing a chemical mechanical polishing;
measuring a thickness of the electrically insulating layer;
determining a sensor stripe height for achieving a desired magnetic stabilization based at least in part upon the measured thickness of the electrically insulting layer;
slicing the wafer into rows; and
performing a lapping operation so as to achieve the determined sensor stripe height;
wherein the stripe height is determined using a master stabilization curve that relates the stripe height thickness with the magnetic stabilization.

21. A method for manufacturing a magnetoresistive sensor, comprising:
providing a wafer;
forming a first electrically conductive lead layer on the wafer;
depositing a plurality of sensor layers over the substrate;
forming mask structure over the plurality of sensor layers, the first mask structure having a width configured to define a width of a sensor stack;
performing a ion milling to remove a portion of the sensor layers that is not protected by the mask structure;
depositing an electrically insulating material;
depositing a hard magnetic material;
performing a chemical mechanical polishing;
measuring a thickness of the electrically insulating layer;
determining a sensor stripe height for achieving a desired magnetic stabilization based at least in part upon the measured thickness of the electrically insulting layer;
slicing the wafer into rows; and
performing a lapping operation so as to achieve the determined sensor stripe height;
wherein the stripe height is determined using a first master stabilization curve that relates the thickness of the electrically insulating layer with the thickness of the hard magnetic layer after lapping and a second master stabilization curve that relates stripe height with magnetic stabilization.

22. A method for manufacturing a magnetoresistive sensor, comprising:
forming a magnetoresistive sensor stack having first and second sides;
forming an electrically insulating layer at each of the sides, the electrically insulating layer having a thickness;
forming a hard magnetic bias layer adjacent to the electrically insulating layer;

measuring an actual thickness of the electrically insulating layer after formation of the electrically insulating layer; and determining a bias layer thickness that is necessary to achieve a desired amount of free layer biasing, based on the measured insulation layer thickness; and adjusting the bias layer thickness to achieve the desired amount of free layer biasing.

\* \* \* \* \*